United States Patent [19]

Fedeli et al.

[11] Patent Number: 4,608,677
[45] Date of Patent: Aug. 26, 1986

[54] MAGNETIC BUBBLE STORE

[75] Inventors: Jean-Marc Fedeli, St. Egreve; Hubert Jouve, Biviers, both of France

[73] Assignee: Commissariat a l'Energie Atomique, Paris, France

[21] Appl. No.: 596,701

[22] Filed: Apr. 4, 1984

[30] Foreign Application Priority Data

Apr. 8, 1983 [FR] France ............................ 83 05791

[51] Int. Cl.⁴ ............................................. G11C 19/08
[52] U.S. Cl. ......................................... 365/19; 365/15
[58] Field of Search ...................... 365/15, 19, 20, 21, 365/16

[56] References Cited

U.S. PATENT DOCUMENTS

| 3,678,479 | 7/1972 | Owens | 340/174 TF |
| 4,012,724 | 3/1977 | Hanson et al. | 365/32 |
| 4,387,443 | 6/1983 | Sakamoto | 365/19 |
| 4,493,054 | 1/1985 | Boshra-Riad | 365/19 |
| 4,507,754 | 3/1985 | Pougnet | 365/19 |

FOREIGN PATENT DOCUMENTS 2189839 1/1974 France.

OTHER PUBLICATIONS

AIP Conference Proceedings on Magnetism & Magnetic Materials, No. 24, (Dec. 3-6, 1974), T. J. Walsh et al, "Novel Bubble Drive", pp. 550-551.

Primary Examiner—James W. Moffitt
Attorney, Agent, or Firm—Oblon, Fisher, Spivak, McClelland & Maier

[57] ABSTRACT

The invention relates to a magnetic bubble store.

This store comprises a magnetic garnet layer (1), in which can be formed magnetic bubbles, which are respectively localized by cells. Each cell comprises a pair of localization windows (2, 3), respectively cut from conductive strips (4, 5) of a pair of conductive strips. These strips are insulated from one another and from the garnet and can be respectively traversed by currents ($I_1$, $I_2$) for displacing the bubble optionally located in the cell and means (21) for detecting each bubble. The memory is characterized in that the strips of each pair of strips have directions (X, Y) perpendicular to one another, the currents ($I_1$, $I_2$) in said strips being respectively parallel to said directions (X, Y).

6 Claims, 4 Drawing Figures

MAGNETIC BUBBLE STORE

BACKGROUND OF THE INVENTION

1. Field of the Invention

The present invention relates to a magnetic bubble store. It applies to the storage of binary information in the form of separate magnetic domains, called bubbles, in a layer of magnetic garnet. These domains have a magnetization which is the reverse of that of the magnetic garnet.

2. Description of the Background

Each bubble can be displaced by a force and the movement of the bubble can take place freely in any random direction in the plane of the magnetic garnet layer. The bubbles are formed in the garnet layer by applying a continuous magnetic field thereto perpendicular to the plane of the layer. In practice, the field is produced by a permanent magnet and ensures the non-volatility of the information contained in the store. The magnetic garnet layer in which the bubbles are formed is generally supported by an amagnetic monocrystalline garnet.

It is known to displace bubbles contained in the magnetic garnet by means of conductive strips or sheets traversed by currents and having windows making it possible to fix the course of the bubbles in said garnet. These sheets are electrically insulated from one another and from the garnet. It is also known to displace the bubbles in the garnet by means of a rotary magnetic field, said bubbles being guided along the boundaries of patterns defined by the ion implantation zones of said garnet. In both cases, the bubbles are displaced as in a shift register. The information constituted by the garnet is displaced for each rotation of the rotary magnetic field or each current pulse cycle in the conductive sheets or strips. This organization in shift register form is the most widely used. The reading of an information contained in the store requires a number of displacements dependent on the number of positions which said information has to traverse in the shift register for it to pass from the position in which it is located up to the end of the register. Thus, this organization requires very long access time and access is then said to be "sequential", because access to the information is a series access necessitating sequences, either in the form of rotations of a rotary field, or of pulses in perforated sheets traversed by a current.

The present invention is more particularly directed at bubble stores in which the bubbles are displaced as a result of currents traversing the perforated conductive sheets. In per se known manner, such a store generally has two conductive sheets in which there are windows. These sheets are parallel to one another and are traversed by parallel currents. The bubbles can be transferred between two cells of memories reference marked by windows by a displacement perpendicular to the currents traversing each of the strips in which these windows are formed. The bubbles can also be displaced between two storage cells designated by windows, as a result of currents parallel to the displacement direction of the bubbles. The currents are nevertheless parallel to one another in the two sheets for displacements parallel or perpendicular to the currents. A known store of this type is described in U.S. Pat. No. 4,134,358. In the store described in this patent, the superimposed conductive sheets are respectively traversed by parallel currents and the displacements of the bubbles in the store are perpendicular to the direction of said currents for storage or minor registers, whilst the displacements are parallel to these currents in the major or access register.

This known type of bubble store, in which the conductive sheets are traversed by parallel currents has the major disadvantage of only permitting an organization of the store in the form of storage or minor registers and access or major registers, the access to the information in the store can only be sequential. With this type of store, it is not possible to obtain direct access in a first phase to a matrix of cells of said store and then obtain access in a second phase to each of the cells of the matrix in a sequential manner, in order to bring about a pseudorandom access. This type of store also suffers from the advantage of making impossible a random access to the cells of said store, in order to modify the information contained therein, by simply modifying the direction of the currents circulating in the conductive strips, and without requiring sequential actions.

SUMMARY OF THE INVENTION

The object of the invention is to obviate these disadvantages by providing a simple bubble store in which access can either be pseudorandom, or random. These objects are achieved by the use of conductive strips arranged in perpendicular manner and in which respectively circulate perpendicular currents.

The invention relates to a magnetic bubble store incorporating a magnetic garnet layer, in which can be formed magnetic bubbles respectively localized by cells, each cell having a pair of localization windows respectively cut from the conductive strips of a pair of conductive strips, said strips being insulated from one another and from the garnet and can be respectively traversed by currents for displacing the bubble possibly located in the cell, as well as means for detecting each bubble, characterized in that the strips of the pair of strips have directions perpendicular to one another, the currents in these strips being respectively parallel in these directions.

According to another feature, the windows of each pair are rectangular and perpendicular to one another, one of the windows having a surface portion common to the other window, in the vicinity of the median part of said other window.

According to another feature, each pair of strips comprises a plurality of pairs of localization windows and a plurality of intermediate windows arranged so as to form a matrix of cells organized into at least one bubble storage or minor register and at least one access or major register for giving access to the bubbles stored in the minor register.

According to another feature, the memory comprises a plurality of cells respectively defined by rows and columns, each row being formed by a first strip common to a plurality of pairs of strips and each column being formed by a second strip common to a plurality of pairs of strips, the rows being parallel and separate from one another and the columns being parallel and separate from one another.

According to another feature, the rows and columns are respectively connected to the outputs of two multiplexers for selecting rows and columns in order to select at least one strip corresponding to a row and at least one strip corresponding to a column, for displacing a bubble possible present in the corresponding cell by currents applied to the selected strips.

BRIEF DESCRIPTION OF THE DRAWINGS

The characteristics and advantages of the invention can be gathered from the following description with reference to the attached drawings, wherein show.

DESCRIPTION OF THE PREFERRED EMBODIMENTS

Figure 1:
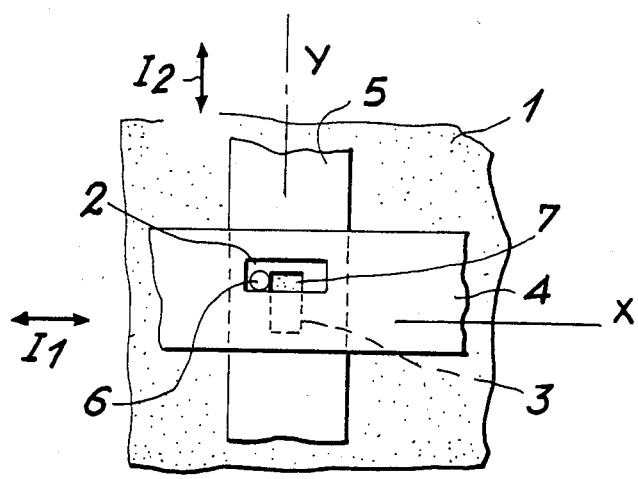
FIG. 1 diagrammatically an elementary cell of a store according to the invention.

FIG. 1 diagrammatically shows an elementary cell of a bubble store according to the invention. The store is constituted by a plurality of said elementary cells and comprises a magnetic garnet layer 1, in which can be formed magnetic bubbles localized by one or more elementary cells. Each cell comprises a pair of windows 2, 3, respectively cut from the conductive strips 4, 5 of a pair of conductive strips. These strips are insulated from one another and from the magnetic garnet 1. They can be respectively traversed by currents $I_1$, $I_2$ in order to displace the bubble 6, optionally present in the cell.

According to the invention, these strips respectively have directions X, Y perpendicular to one another and the currents $I_1$, $I_2$ respectively circulating in these strips are parallel to directions X, Y. Currents $I_1$, $I_2$ are of the pulse type and can flow in these strips, either in one direction, or in the other, so as to displace the bubble 6 located e.g. on the left-hand part of window 2, in order to bring it into a facing position with respect to window 3 and then finally to bring it into the right-hand part of window 2.

Windows 2, 3 of each pair of windows are rectangular and perpendicular to one another. One of the windows has a surface portion 7 in common with the other window, in the vicinity of the median part of said other window. FIG. 1 does not show the substrate on which the magnetic garnet layer 1 can be deposited. Obviously, the bubbles are formed in the garnet by applying a constant magnetic field, perpendicular to the plane of said garnet layer.

Figure 2:
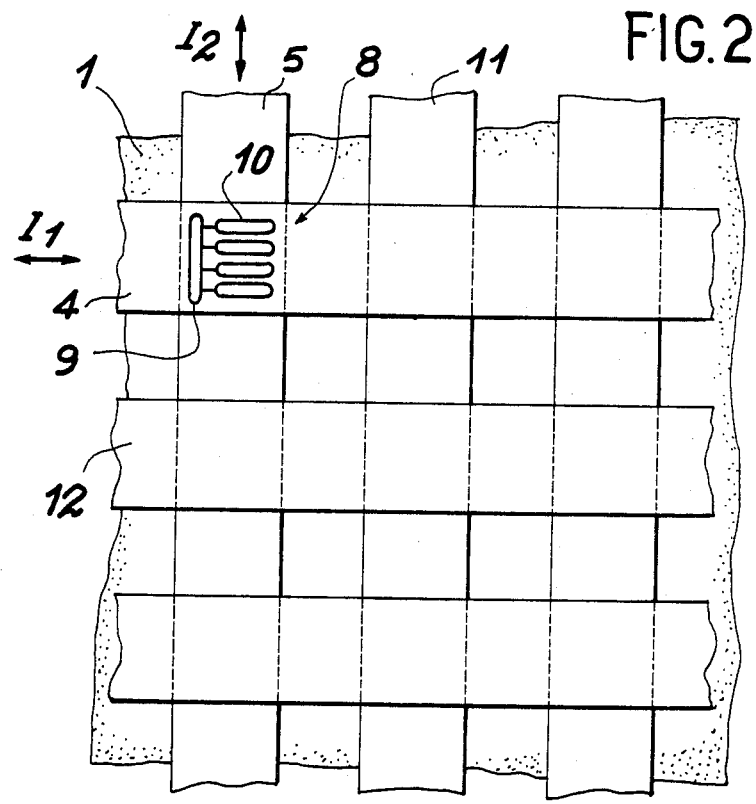
FIG. 2 diagrammatically and in plan view, a first embodiment of a bubble store according to the invention, the access to said store being pseudorandom.

FIG. 2 diagrammatically shows in a plan view a first embodiment of a bubble store according to the invention. In this embodiment, the store has a plurality of pairs of strips. Each pair of strips, such as e.g. 4, 5, comprises a plurality of pairs of bubble localization windows, as well as intermediate windows, which will be described in greater detail hereinafter. These windows are arranged so as to form a matrix 8 of cells, which are organized so as to form at least one minor bubble storage register 10 and at least one major register 9 for giving access to the bubble stored in the minor register. It is obvious that other matrixes comparable to matrix 8 are formed at the intersection of other pairs of strips, such as 4-11 or 5-12, etc. The currents flowing in the strips of e.g. pair 4-5 are respectively designated $I_1$, $I_2$.

The structure of this memory in the first embodiment has the advantages of a matrixed structure. Each matrix is addressed by the activation of two transverse currents, such as $I_1$ and $I_2$. Thus, the operator can very rapidly have access to a matrix of cells by simply activating two currents.

Thus, for example, for a store having a million bits, subdivided into 100 cell matrixes, the operator very rapidly has access to 10,000 cells of each matrix and can therefore very rapidly obtain the information of interest to him in the cells of said matrix. Thus, access to each matrix is of the random type but, as will be shown hereinafter, access to the information in the cells of each matrix is of the sequential type, because each of these matrixes is organized in the form of major registers and minor registers. The access to each matrix is of a random nature and the access to the cells of a matrix is of a sequential nature, so that with respect to the first embodiment, the store can be called a pseudorandom access store.

Figure 3:
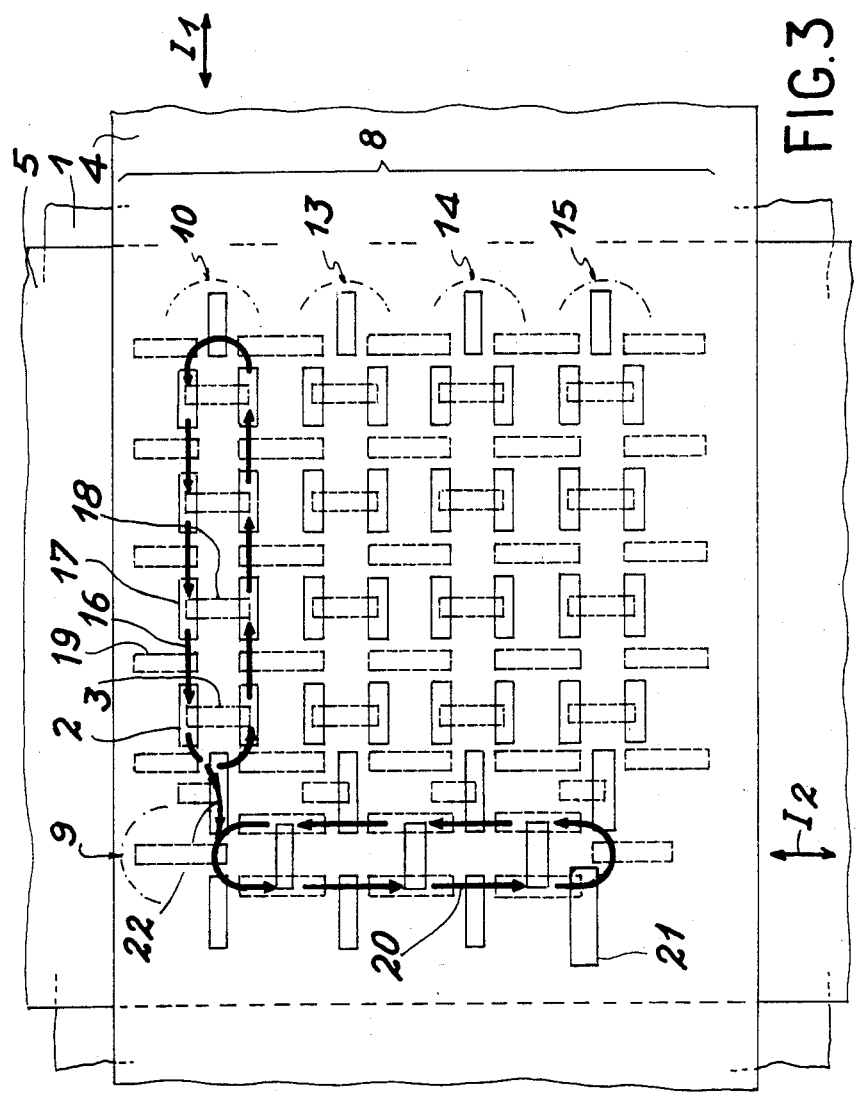
FIG. 3 in greater detail, a matrix of cells of the pseudorandom access store of FIG. 2.

FIG. 3 shows in greater detail one of the matrixes 8 of the storage cells in the first embodiment of the store according to the invention. As stated hereinbefore, this matrix comprises minor registers 10, 13, 14, 15 making it possible to store the bubbles and at least one major or access register 9. The travels of the bubbles in the minor registers and in the major register are diagrammatically indicated by loops 16, 20. It is possible to see that the passage of a bubble from the minor register to a major register takes place without any access gate. In addition, said passage takes place bit by bit. In the minor registers, the pairs of localization windows such as 2-3 and 17-18 are separated by intermediate windows 19 making it possible to guide each bubble when the latter passes from one cell to the next. Each end of the major register comprises a bubble detector 21, which can e.g. be an iron-nickel alloy band, which is insulated from the conductive strips 4-5. It is also possible to see the magnetic garnet layer 1 on which are arranged the conductive strips. Currents $I_1$, $I_2$ make it possible to have access to matrix 8, whilst access to the bubbles contained in a minor register, such as e.g. 10, takes place sequentially by means of major register 9. The bubbles are detected at the end of major register 9 by detector 21. Arrow 22 diagrammatically indicates the travel of a bubble passing from minor register 10 to major register 9.

Figure 4:
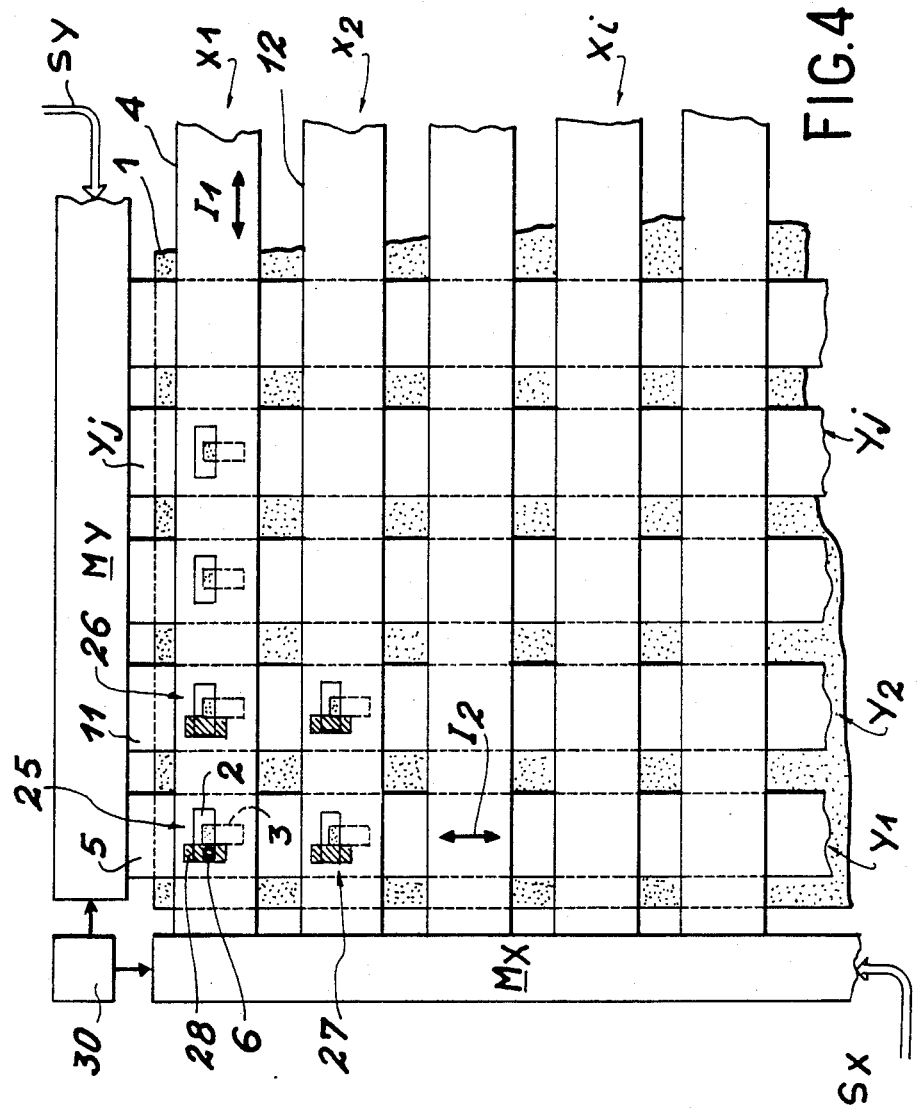
FIG. 4 diagrammatically and in plan view, a second embodiment of a store according to the invention, access to said store being random.

FIG. 4 shows diagrammatically and in plan view a second embodiment of a store according to the invention, in which access to the store is completely random.

In this embodiment, the memory has a plurality of cells 25, 26, 27, etc., respectively designated by the intersections of rows $X_1$, $X_2$, ..., $X_i$ and columns $Y_1$, $Y_2$, ..., $Y_j$. Each row $X_i$ is formed by a first strip common to a plurality of pairs of strips and each column is formed by a second strip common to a plurality of pairs of strips. Thus, for example, row $X_1$ is formed by the first strip 4 of the pairs of strips 4-5, 4-11, etc. and column $Y_1$ is formed by the second strip 5 of pairs of strips 5-4, 5-12, etc. Each localization cell located at the intersection of a row and a column comprises, in the manner indicated hereinbefore, two windows 2, 3 respectively cut from strip 4, 5. Rows $X_1$, $X_2$, ..., $X_i$ are parallel and separated from one another. Columns $Y_1$, $Y_2$, ..., $Y_j$ are also parallel and separated from one another. The rows and columns are perpendicular and are respectively connected to the outputs of two row and column selection multiplexers MX and MY. These multiplexers make it possible to select at least one strip corresponding to a row and at least one strip corresponding to a column in order to displace a bubble optionally present in the cell corresponding to said row and said column by currents applied to the selected strips. The selection of a row and a column takes place by means of selection signals SX and SY applied to the control inputs of multiplexers MX and MY. The latter are supplied by a power supply 30 able to supply pulse-type currents to the multiplexers and which can flow in the rows and columns in one or other direction. Thus, for example, when it is wished to modify the information obtained in cell 25 and represented by bubble 6, currents are applied to the strips corresponding to row $X_1$ and column $Y_1$. The stored information can be coded in the following way. When bubble 6 is on the left-hand part of window 2, it can be agreed that the presence of this bubble at this location corresponds to a logic 1, whilst when the bubble is absent from this location and is located to the right of window 2, the information corresponds to a logic zero. The stored information is read by bubble detectors such as 28 (e.g. an iron-nickel alloy band), which are also reference marked by rows and columns. These detectors are known in the art and are not described in detail here.

The store described hereinbefore for this second embodiment of the invention is consequently a random access store and also has the advantage of bring non-volatile.

We claim:

1. Magnetic bubble store incorporating a magnetic garnet layer (1), in which can be formed magnetic bubbles localized respectively by cells, each cell having a pair of localization windows (2, 3) respectively cut from conductive strips (4, 5) of a pair of conductive strips, said strips being insulated from one another and from the garnet and can be respectively traversed by currents ($I_1$, $I_2$) for displacing the bubble possibly located in said cell, as well as means (21) for detecting each bubble, the strips of the pair of strips having directions (X, Y) perpendicular to one another, the currents ($I_1$, $I_2$) in said strips being respectively parallel to said directions (X, Y) characterized in that the windows (2, 3) of each pair are rectangular and perpendicular to one another, one of the windows (3) having only at an extremity a surface portion (7) common to the other window (2), in the vicinity of the median part of said other window (2).

2. Bubble store according to claim 1, characterized in that each pair of strips (4-5) comprises a plurality of pairs of localization windows (2-3, 17-18, etc.) and a plurality of intermediate windows (19) disposed in such a way as to form a matrix (8) of cells organized into at least one bubble storage or minor register (10) and at least one major register (9) or access register for giving access to the bubbles stored in the minor register.

3. Bubble store according to claim 1, characterized in that it comprises a plurality of cells (25, 26, 27, etc.) respectively designated by the rows and columns ($X_1, \ldots X_i, Y_1 \ldots Y_j$), each row ($X_1$) being formed by a first strip common to a plurality of pairs of strips (4-5, 4-11) and each column ($Y_1$) being formed by a second strip common to a plurality of pairs of strips (5-4, 5-12), the lines ($X_1, \ldots X_i$) being parallel and separated from one another and the columns ($Y_1, \ldots Y_j$) being parallel and separated from one another.

4. Bubble store according to claim 3, characterized in that the rows ($X_1, \ldots X_i$) and the columns ($Y_1 \ldots Y_j$) are respectively connected to the outputs of two row and column selection multiplexers (MX, MY) for selecting at least one strip (4) corresponding to a row ($X_1$) and at least one strip (5) corresponding to a column ($Y_1$), in order to displace a bubble possibly present in the corresponding cell (25) by means of currents ($I_1$, $I_2$) applied to the selected strips.

5. A magnetic bubble storage device, comprising:
a magnetic garnet layer in which magnetic bubbles are formed;
conductive strips formed on the surface of said garnet layer, a first group of said strips being parallel to each other and a second group of strips being parallel to each other and perpendicular to the strips of said first group, said strips being insulated from each other and from said garnet layer;
cells formed at the intersections of the strips, in which said bubbles are localized;
electric currents flowing in said strips for displacing said bubble;
means for detecting each bubble;
each cell having a first window formed in the strip of said first group and a second window formed in the strip of said second group, said windows being rectangular and perpendicular to each other and having an overlapping portion, said portion being at the extremity of one of said windows and near the center of the other of said windows;
a first multiplexer connected to said first group of strips for selecting one strip therefrom; and
a second multiplexer connected to said second group of strips for selecting one strip therefrom;
said first and second multiplexers acting together to select one cell in order to control the bubble at that cell by means of said current supplied to the selected strips.

6. A magnetic bubble storage device, comprising:
a magnetic garnet layer in which magnetic bubbles are formed;
conductive strips formed on the surface of said garnet layer, a first group of said strips being parallel to each other and a second group of strips being parallel to each other and perpendicular to the strips of said first group, said strips being insulated from each other and from said garnet layer;
cells formed at the intersections of the strips, in which said bubbles are localized;
electric currents flowing in said strips for displacing said bubble;
means for detecting each bubble;
each cell having a first window formed in the strip of said first group and a second window formed in the strip of said second group, said windows being rectangular and perpendicular to each other and having an overlapping portion, said portion being at the extremity of one of said windows and near the center of the other of said windows;
each intersection of said strips having a plurality of first windows, a plurality of second windows and a plurality of intermediate windows disposed to form a matrix of cells arranged in at least one minor register and at least one major register which gives access to the bubbles stored in said minor register.

* * * * *